(12) United States Patent
Aoki

(10) Patent No.: US 6,297,634 B1
(45) Date of Patent: Oct. 2, 2001

(54) MRI MAGNETIC FIELD GENERATOR

(75) Inventor: Masaaki Aoki, Takatsuki (JP)

(73) Assignee: Sumitomo Special Metals Co., Ltd., Osaka (JP)

( * ) Notice: Subject to any disclaimer, the term of this patent is extended or adjusted under 35 U.S.C. 154(b) by 0 days.

(21) Appl. No.: 09/486,873

(22) PCT Filed: Jun. 16, 1999

(86) PCT No.: PCT/JP99/03232
§ 371 Date: Feb. 14, 2000
§ 102(e) Date: Feb. 14, 2000

(87) PCT Pub. No.: WO99/65392
PCT Pub. Date: Dec. 23, 1999

(30) Foreign Application Priority Data

Jun. 19, 1998 (JP) .................................................. 10-189716

(51) Int. Cl.[7] ........................................................ G01V 3/00
(52) U.S. Cl. ............................................... 324/315; 324/318
(58) Field of Search .................................. 324/315, 318, 324/319, 320, 322, 300

(56) References Cited

U.S. PATENT DOCUMENTS 4,663,592 * 5/1987 Yamaguchi et al. .................. 324/315

5,652,517 * 7/1997 Maki et al. ............................ 324/318

* cited by examiner

Primary Examiner—Louis Arana
(74) Attorney, Agent, or Firm—Dykema Gossett PLLC

(57) ABSTRACT

An MRI-use magnetic field generator structured such that there is no loss of magnetic field uniformity, temperature fluctuation is reduced and thermal efficiency enhanced, and the temperature of the permanent magnets can be controlled to high precision. With this invention, temperature control heaters are embedded in the base yokes of magnetic path formation members, and as a result of this structure, when the temperature control heaters are heated by a temperature regulator according to the temperature detected by a temperature sensor, the permanent magnets disposed in the vicinity of the base yokes are heated efficiently, so control follow-up is excellent. Furthermore, because the temperature control heaters are embedded inside the base yokes, and the heat generated by the heaters is conducted through the base yokes and reaches the permanent magnets directly, the heat is not diffused to the outside and lost, affording extremely efficient thermal control.

15 Claims, 8 Drawing Sheets

MRI MAGNETIC FIELD GENERATOR

TECHNICAL FIELD

This invention relates to an improvement to a magnetic field generator used in a medical-use magnetic resonance imaging device (hereinafter referred to as an MRI device), and more particularly, this invention relates to an MRI-use magnetic field generator that controls the temperature of permanent magnets that serve as the magnetic field generation source by measuring the temperature of the permanent magnets and using a heating means or cooling means incorporated into base yokes or the like, so that any unevenness in the temperature distribution of the permanent magnets is efficiently reduced without any loss of uniformity in the magnetic field generated within an imaging space.

BACKGROUND ART

An MRI device is designed so that all or part of a patient's body is inserted into the cavity of a magnetic field generator that forms a powerful magnetic field, and a body section image of the desired area is obtained, allowing a graphic representation to be made even of the texture of the tissue of this area.

With the above-mentioned MRI-use magnetic field generator, the cavity must be wide enough for all or part of the patient's body to be inserted, and a stable, powerful, and uniform magnetic field having a precision of at least $1 \times 10^{-4}$ at 0.02 to 2.0 T usually must be formed within the imaging space inside the cavity for a sharp body section image to be obtained.

FIGS. 9A and 9B illustrate a known structure of a magnetic field generator used in an MRI device (Japanese Patent Publication H2-23010). Specifically, permanent magnets 30, which make use of R—Fe—B-based magnets as the magnetic field generation source, are fixed to the opposing sides of a pair of base yokes 35, pole pieces 31 are fixed opposite one another on the various magnetic pole sides, and a static magnetic field is generated within the cavity 33 between the pole pieces 31. The illustrated magnetic circuit is achieved by connecting columnar support yokes 36 between the pair of flat base yokes 35. 37 in the figure is a tilt field coil, and 38 is an imaging space formed in the center within the cavity 33.

The pole pieces 31 are usually made from a flat bulk material (a single piece) produced by planing down electromagnetic soft iron, pure iron, or another such magnetic material. A structure in which an annular protrusion 32 is provided around the periphery, or a protrusion is provided in the center (not shown) (Japanese Utility Model Publication H5-37446), or the like may be employed in order to enhance the uniformity of magnetic field distribution within the cavity 33.

Because of their relatively low maintenance costs, compact size, and other advantages, permanent magnets are increasingly being utilized as the magnetic field generation source for forming a static magnetic field within the cavity 33. A drawback to these permanent magnets, however, is that the field intensity tends to vary with changes in the temperature due to the magnetic characteristics inherent to the magnets themselves.

The stability of the intensity of the static magnetic field formed in the cavity is important with an MRI device, and ways of keeping the field intensity stable include covering the entire magnetic field generator, or just the required portions, with an adiabatic material so that the permanent magnets are kept at a constant temperature, and providing cooling or heating means on the inside of the base yokes or the above-mentioned adiabatic material.

For instance, with a known structure in which a cooling means is provided in order to reduce the effect that temperature changes have on the static magnetic field generated by an MRI device, the temperature is controlled with a cooling apparatus in which electronic cooling elements that utilize the Peltier effect are disposed around the outer periphery of the base yokes (Japanese Utility Model Publication H3-56005). Specifically, the above-mentioned cooling apparatus cools the entire magnetic field generator to within a temperature range that is 10 to 50° C. lower than the ambient temperature, changes in the ambient temperature are moderated by an adiabatic material that surrounds the device, and the temperature is fine-tuned to a specific range.

During diagnosis with an MRI device, the room temperature is usually kept at about 22 to 25° C. so that a clothed patient can be examined in comfort. The structure described above requires that the MRI device be kept at all times at a temperature lower than room temperature, but this is impractical because of inefficiency from the standpoint of energy consumption, and because the structure for cooling the entire structure makes the device larger and more expensive than with the structure discussed below in which a heating means is provided.

A structure in which a heating means is provided makes it easier to obtain a compact and inexpensive device than the above-mentioned structure in which a cooling apparatus is provided, and is said to be more efficient in terms of energy consumption. Examples of such structures are known from Japanese Laid-Open Patent Applications S63-43649 and S63-278310.

Specifically, it is common to use a structure in which any of various heating means are used to control the entire magnetic field generator to a temperature that is about 5 to 10° C. lower than the room temperature where the MRI device is installed.

The magnetic field generator shown in FIG. 10 is structured such that flat base yokes 42 are disposed across from one another via columnar support yokes 43, permanent magnets 40 are fastened to the opposing sides thereof, and pole pieces 41 are provided to the magnetic pole sides thereof. A planar heater 44 is disposed on the outer surface of each of the base yokes 42, a planar heater (not shown) is also disposed on the inner surfaces of the adiabatic materials 45, and these yokes are entirely covered with the adiabatic material 45.

With a structure such as this, electrical current is sent from a power source (not shown), and the temperature of the magnetic circuit is controlled.

Japanese Laid-Open Patent Application S63-43649 proposes a structure in which planar heaters are disposed only on the inner surfaces of the above-mentioned adiabatic materials 45. The problem with this structure, though, is that the temperature of the magnetic circuit is controlled by using a fan to forcibly send air heated by the planar heater through an air passage formed between the flat base yoke 42 and the adiabatic material 45, so not only is the device complicated, but because the magnetic circuit is heated via air, the thermal efficiency is also poor.

An object of the invention of Japanese Laid-Open Patent Application S63-278310 is to solve the above problems, and as shown in FIG. 10, the thermal efficiency is improved somewhat by directly disposing the planar heaters 44 on the outer surfaces of the base yokes 42 on which the permanent magnets 41 are disposed. However, because the heaters 44 are disposed on the outer surfaces of the base yokes 42, that is, on the sides opposite from the cavity-facing sides of the permanent magnets 40, there is a pronounced tendency for the heat to be diffused from the magnetic circuit to the outside, so no improvement in thermal efficiency is realized.

Furthermore, Japanese Laid-Open Patent Application H8-266506 (U.S. Pat. No. 5,652,517) discloses a structure that improves on the invention discussed in Japanese Laid-Open Patent Application S63-278310. The structure of Japanese Laid-Open Patent Application H8-266506 is characterized in that a thermally conductive material is attached, either directly or via a gas, to the side faces of upper and lower base yokes to which permanent magnets are attached.

The heater means in Japanese Laid-Open Patent Application H8-266506 is in the form of a sheet heater, and an AC sheet heater and a DC sheet heater are fixed one above the other to the side faces of the base yokes. The fixing is accomplished by covering the AC sheet heater and the DC sheet heater with a fixing bake plate from above and bolting the plate down.

Japanese Laid-Open Patent Application H8-266506 states that the above structure affords improvements in thermal efficiency, control follow-up properties, and ease of work as compared to the structures disclosed in Japanese Laid-Open Patent Applications S63-43649 and S63-278310.

Still, because even the structure in Japanese Laid-Open Patent Application H8-266506 makes use of planar heaters, there is fundamentally a great deal of thermal radiation to the sides opposite the sides in contact with the yokes, so thermal efficiency is poor. Also, it is indicated that a temperature sensor is only disposed in the vicinity of the center on the top face of the upper base yoke, and that the temperature of all the planar heaters is controlled according to the temperature detected by this lone temperature sensor. In other words, this structure involves controlling the temperature of the entire magnetic circuit with a single control system, so there is a wide temperature variance, and uniformity of the magnetic field is also lost.

SUMMARY OF THE INVENTION

It is an object of this invention to solve the problems encountered in the past related to the temperature control of permanent magnets, and it is a further object to provide an MRI-use magnetic field generator structured such that there is no loss of magnetic field uniformity, temperature fluctuation is reduced and thermal efficiency enhanced, and the temperature of the permanent magnets can be controlled to high precision.

As a result of various investigations aimed at finding a structure with which the temperature of the permanent magnets could be controlled to high precision, the inventors turned their attention to the fact that because planar sheet heaters were employed in the past as heating means, for example, heat radiated out from sides other than those where the magnetic circuit was provided, resulting in poor thermal efficiency. With this in mind, the present invention was perfected upon discovering that the thermal efficiency can be improved and operating costs can be reduced by incorporating the temperature control means (mainly just the heating means, or the heating means and heat radiating (cooling) means) into the base yokes where the permanent magnets are provided, for example, and that the follow-up properties of temperature control can also be enhanced by disposing the above-mentioned heating means or other such temperature control means in the vicinity of the permanent magnet.

Specifically, this invention is an MRI-use magnetic field generator that forms a magnetic circuit with magnetic path formation members and permanent magnets serving as magnetic field generation sources, and that generates a magnetic field within an imaging space, this MRI-use magnetic field generator having temperature control means incorporated into the permanent magnets and/or the magnetic path formation members.

With the above-mentioned MRI-use magnetic field generator, the inventors also propose a structure in which temperature sensors are disposed in the permanent magnets and/or the magnetic path formation members, a structure in which there is a temperature regulator which controls the temperature of the temperature control means according to the temperature detected by the temperature sensors, and a structure having means for halting the temperature control means according to the temperature of the permanent magnets and/or the magnetic path formation members.

Also proposed, as a particularly favorable structure, is a structure in which, in an MRI-use magnetic field generator in which a pair of permanent magnets are disposed facing each other via a cavity, there are at least two control systems that independently control the various temperatures of the pair of permanent magnets.

BEST MODE FOR CARRYING OUT THE INVENTION

As long as its structure is such that a magnetic circuit is formed by magnetic path formation members and permanent magnets that serve as the magnetic field generation sources, and a magnetic field is generated in an imaging space, the MRI-use magnetic field generator that is the object of the present invention is not limited to the examples given below, and can be applied to any structure.

For instance, the present invention can also be applied to a structure in which a pair of flat base yokes are linked by a plurality of columnar support yokes, a structure in which a pair of opposing, flat base yokes are supported at one end by a flat support yoke, a structure in which pole pieces are disposed on the cavity-facing side of the permanent magnets that serve as the magnetic field generation source, a structure in which no pole pieces are provided, and so forth.

The magnetic field strength, magnetic field uniformity and size of the cavity required by the magnetic path formation member dimensions of the flat base yokes should be suitably selected according to each of the various properties.

Ferrite magnets, rare earth cobalt-based magnets, or another known magnet material can be used as the permanent magnets that serve as the magnetic field generation sources. In particular, the device can be made much more compact by using an Fe—B—R-based permanent magnet in which R is a light rare earth such as Nd and Pr, which are abundant resources, and in which boron and iron are the main components, exhibiting an extremely high energy volume of 30 MGOe or higher. A structure in which the above-mentioned known permanent magnets are disposed in combination allows a more economical magnetic field generator to be provided without increasing the size of the device.

Conventional materials such as electromagnetic soft iron or pure iron can be used as the material for the yokes that serve as the magnetic path formation members. The use of base yokes allows the field intensity to be equalized, and also ensures that the entire magnetic circuit will have good mechanical strength, facilitating the work of assembling the device.

The function of the support yokes is to mechanically support the base yokes and ensure the required cavity dimensions, as well as to form a magnetic path for forming a magnetic field within the cavity.

The material of which the pole pieces are made is not limited to the materials in the working examples. For instance, pure iron, or a soft magnetic powder that has been molded with an electrically resistant material, or the like can be employed. The residual magnetism and eddy current generated at the pole pieces during application of a pulse field to the tilt field coils can be reduced by employing pole pieces made from a laminate of silicon steel sheets or from any of a variety of soft ferrites based on Mn—Zn, Ni—Zn, or the like, which have a low coercive force and high electrical resistance, or from a combination of these materials.

Figure 7A:
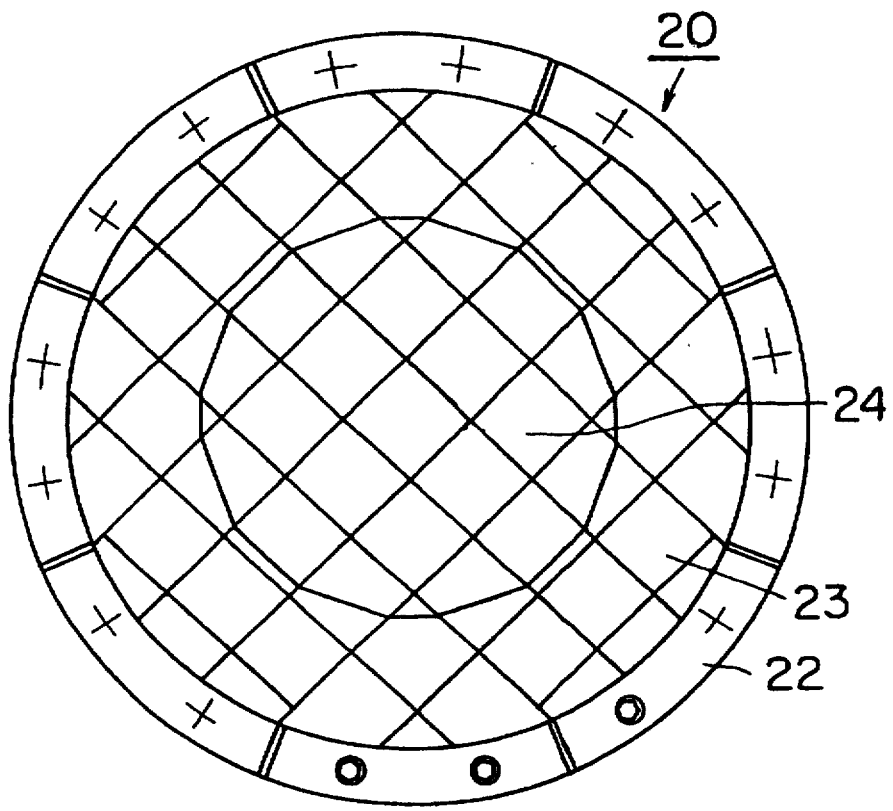
FIG. 7A is a top view illustrating the structure of a pole piece of the MRI-use magnetic field generator of the present invention.
Figure 7B:
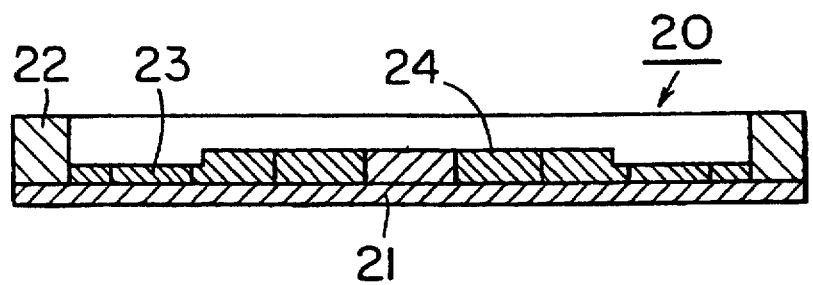
FIG. 7B is a vertical cross section thereof.

In particular, a laminate of silicon steel sheets is advantageous from a cost standpoint because it is less expensive than a soft ferrite. The reduction in eddy current and residual magnetism will be better and the attachment work will be easier if, as shown in FIGS. 7A and 7B, in producing the pole piece 20 from the above-mentioned silicon steel sheets, a plurality of blocks 23 composed of laminates of silicon steel sheets are arranged on a magnetic material base 21, and these blocks are further laminated.

Optimizing the thickness of the above-mentioned entire pole piece or the thickness ratio of the magnetic material base 21 ensures that the pole piece will have good mechanical strength, equalizes the field intensity required of the pole piece, and prevents eddy current and residual magnetism from occurring. It is also possible to employ a structure in which the magnetic material base 21 is not used by devising some means for fixing the blocks 23 composed of laminates of silicon steel sheets.

Furthermore, it is preferable to form an annular protrusion composed of electromagnetic soft iron, pure iron, or another such magnetic material ring around the periphery of the pole piece in order to enhance the field uniformity within the cavity. In particular, the reduction in eddy current will be even better if one or more slits are provided to divide up the annular protrusion 22 in the circumferential direction as shown in FIGS. 7A and 7B.

The cross sectional shape of the annular protrusion is not limited to the rectangular shape shown in the figure, and may instead be approximately triangular, trapezoidal, or the like, with this shape being suitably selected as dictated by the required field intensity, field uniformity, and so forth. Disposing a protrusion 24 on the inside of the annular protrusion of the pole piece is also effective in terms of forming a uniform magnetic field.

The disposition of pole pieces in not essential in the present invention. Specifically, there are drawbacks to the use of pole pieces, such as a decrease in the field intensity within the cavity due to magnetic flux leakage from the side faces of the pole pieces, a decrease in the tilt field rise characteristics due to the eddy current generated within the pole pieces, and an increase in the weight of the overall magnetic circuit, so a structure in which no pole pieces are disposed is also effective in terms of avoiding these problems. The structure in which no pole pieces are disposed can be, for example, the structure disclosed in Japanese Laid-Open Patent Application H3-209803, which was previously proposed by the inventors of the present invention.

Temperature control in the present invention is such that a temperature regulator operates according to the temperature detected by a temperature sensor, and in the heating or heat radiation (cooling) by the temperature control means, the temperature control means is incorporated into the permanent magnets themselves or into the pole pieces or base yokes disposed in the vicinity of the permanent magnets, so less heat is lost through radiation to the outside, the permanent magnets are heated and cooled extremely efficiently, and the follow-up properties of the control are good. Furthermore, partial temperature control with a plurality of control systems is possible by disposing a plurality of temperature sensors, an advantage of which is less decrease in the symmetry of the magnetic field uniformity.

The temperature control means incorporated into the permanent magnets, base yokes, pole pieces, etc., in the present invention is not limited to the structures illustrated in the working examples, and variety of structures can be employed so long as the temperature control means is disposed in holes formed in the permanent magnets, base yokes, pole pieces, etc., and these can be heated and cooled efficiently.

As described above, for a variety of reasons, a structure in which the entire magnetic field generator is controlled to a temperature about 5 to 10° C. higher than the room temperature where the MRI device is installed is usually used at the present time. In the present invention as well, it is preferable to employ a heating means as the temperature control means for reasons such as energy conservation, cost, and ease of operation.

From the standpoints of thermal efficiency, the service life of the heating means itself, and so forth, the heating means must be in close contact with the members being heated, such as the base yokes. Alternatively, with disposition in holes, it is favorable to use a heat-resistant filler to achieve direct or indirect contact with the members being heated.

A rod-shaped heating element is a particularly favorable device for the heating means because it can be easily inserted into holes formed in the permanent magnets, base yokes, and pole pieces, and is also easy to handle. Specifically, a rod-shaped heating element is a structure such as a tubular heater comprising a heating element held within a metal pipe, with the space inside this pipe filled with an insulator such as MgO. Iron, copper, aluminum, stainless steel, or another such metal or an alloy material can be used for the above-mentioned metal pipe.

If these heating means move within the holes provided in the above-mentioned base yokes or other heated members, or if they are taken out of the holes during use, there is the danger that the desired temperature control will be impossible, or that the heating means themselves could be damaged. It is therefore preferable to use a retaining means for the heating means as shown in FIGS. 5 and 6.

Figure 5:
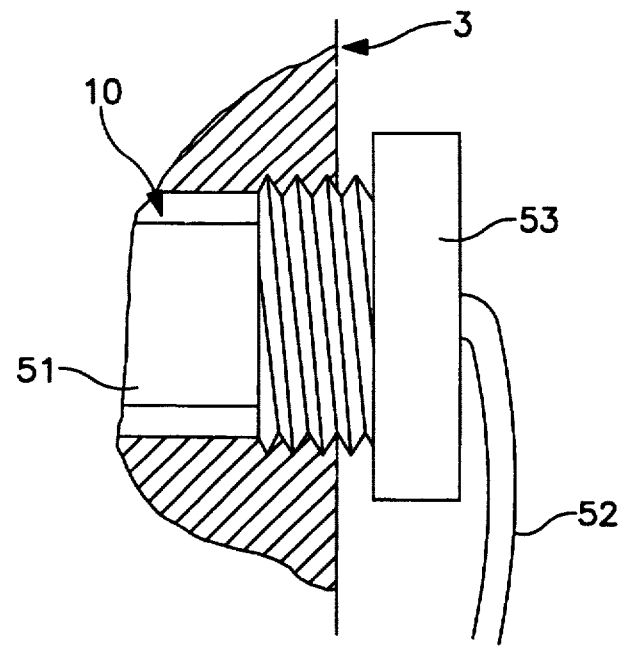
FIG. 5 is a partial vertical cross section illustrating the main components of the retaining means of the temperature control means used in the MRI-use magnetic field generator of the present invention.

FIG. 5 illustrates a retaining means 53 in the form of a bolt that is threaded into a hole formed in the base yoke 3. The rod-shaped heating element 10 that is inserted into the hole is held in place by the bolt-shaped retaining means 53 that strikes the end of a metal pipe 51 that constitutes the rod-shaped heating element 10. In the figure, 52 is a lead wire going from the rod-shaped heating element 10 to the outside.

Figure 6:
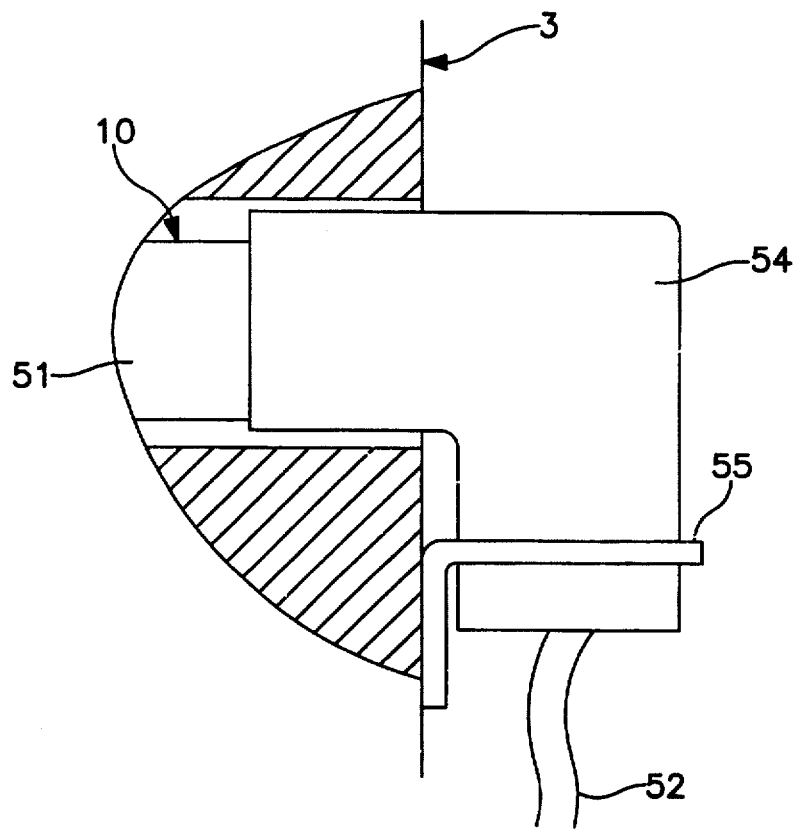
FIG. 6 is a partial vertical cross section illustrating the main components of the retaining means of the temperature control means used in the MRI-use magnetic field generator of the present invention.

FIG. 6 illustrates a retaining means comprising a metal pipe 54 formed in an L-shape and disposed so that it strikes the end of the metal pipe 51 that constitutes the rod-shaped heating element 10, and an attachment bracket 55 that fixes the metal pipe 54 to the base yoke 3.

Various other structures besides the retaining means for a heating means consisting of a rod-shaped heating element shown in FIGS. 5 and 6 can also be employed. For instance, threads may be formed around the outside of the metal pipe 51 that constitutes the rod-shaped heating element 10, or a flange can be provided to the end of the metal pipe 51 for fixing the base yoke 5, among other retaining means that can be employed.

It is also possible to use a cooling means as the temperature control means in the present invention. For the sake of practicality and to prevent the device from being too large or costly, it is preferable to employ a means with a simple structure such as a heat pipe. Specifically, cooling can be accomplished by disposing a heat pipe in holes provided to the permanent magnets, base yokes, or other magnetic path formation members by the same method as with the heating means and actively causing heat to radiate to the outside, or cooling can be effected by introducing a coolant into the members via a heat pipe.

In order to control the temperature of the permanent magnets more precisely, it is also possible to use a rod-shaped heating element (the above-mentioned heating means), a heat pipe (cooling means), or the like together.

The temperature sensors disposed for temperature control in the present invention can be temperature sensing resistors, thermistors, or the like, with a known sensor being used as needed according to the structure of the temperature control system. The temperature sensors may be disposed at suitable locations as dictated by the structure of the magnetic circuit, such as the permanent magnets, base yokes, and pole pieces.

Usually, the goal is achieved by disposing the temperature sensors on the surface of the permanent magnets, base yokes, or pole pieces. To detect the temperature at higher precision, it is favorable to form holes at specific locations of the various members mentioned above, and dispose the temperature sensors in these holes.

Particularly when the temperature sensors are disposed at the pole pieces, it is preferable to dispose them in holes made at locations away from the tilt field coils, such as around the outsides of the annular protrusions, or in the centers of the pole pieces, since noise can be generated by the magnetic field generated by the tilt field coils.

In addition to the circuit configurations given in the working examples, any known electrical control means can also be employed for the temperature control of the permanent magnets by the above-mentioned temperature control means and temperature sensor. A single control system may be used, or two or more systems may be used as needed.

It is particularly favorable to use a plurality of control systems in order to control the temperature of the entire magnetic circuit evenly and without sacrificing the uniformity of the magnetic field. When the magnetic circuit needs to be raised from a relatively low temperature state to a specific temperature, a heating means with a large capacity can be used concurrently in order to shorten the time it takes to raise the temperature. In this case, it is preferable to use a temperature regulator having two types of output: one for fast temperature elevation and one for fine tuning so as to maintain the temperature setting.

In the present invention, in order to utilize the above-mentioned temperature control even more effectively, of the permanent magnets, base yokes, support yokes, and pole pieces that make up the magnetic circuit, the base yokes, which have a relatively large surface area and greatly affect the temperature of the permanent magnet, should preferably have disposed around their periphery an adiabatic material for isolating the heat from the air. Furthermore, besides the base yokes, it is also favorable for the support yokes, permanent magnets, and pole pieces to be surrounded by an adiabatic material as needed.

Moreover, with the MRI-use magnetic field generator of the present invention, means can be provided for halting the operation of the temperature control means should the temperature of the permanent magnets rise markedly higher than the specified temperature due to a malfunction of the above-mentioned temperature sensor or temperature regulator. For instance, to prevent the permanent magnets from being heated to over 45° C., it is good to provide a thermostat for forcibly shutting off the current to the heater, and to prevent the constituent members of the magnetic circuit or the adiabatic material from being burnt, it is good to provide a temperature fuse for forcibly shutting off current to the heater if the temperature exceeds 90° C., for example.

Embodiment

The characteristics of the present invention will now be described through reference to the examples illustrated in FIGS. 1A, 1B, and 2.

The magnetic field generator has magnetic path formation members, which constitute a magnetic circuit, disposed on a floor 1 via legs 2. The magnetic path formation members comprise a pair of flat base yokes 3 connected by four columnar support yokes 4. The magnetic field generation source consists of a pair of permanent magnets 5 featuring R—Fe—B-based magnets. These are attached to the opposing faces of the base yokes 3, and pole pieces 6 are fixed to the respective pole piece faces, forming a cavity 8 in which a static magnetic field is generated between the pole pieces 6. An imaging space 9 is set up within the cavity 8 between the pole pieces 6, and a specific, uniform magnetic field is generated within this space. The pole pieces 6 that serve as magnetic path formation members each have an annular protrusion 7 in this structure, and are formed using the blocks of laminated silicon steel sheets illustrated in FIGS. 7A and 7B.

Holes that are the same length as rod-shaped heating elements are made in the center of the four side faces and the top face or bottom face of the base yokes 3 (made of pure iron) in order to insert the rod-shaped heating elements. A plurality of rod-shaped heating elements (tubular heaters) 10 and 11 are inserted so as to be in close contact with holes formed in the base yokes 3, and are connected to a temperature regulator via leads and relays (not shown).

Figure 8:
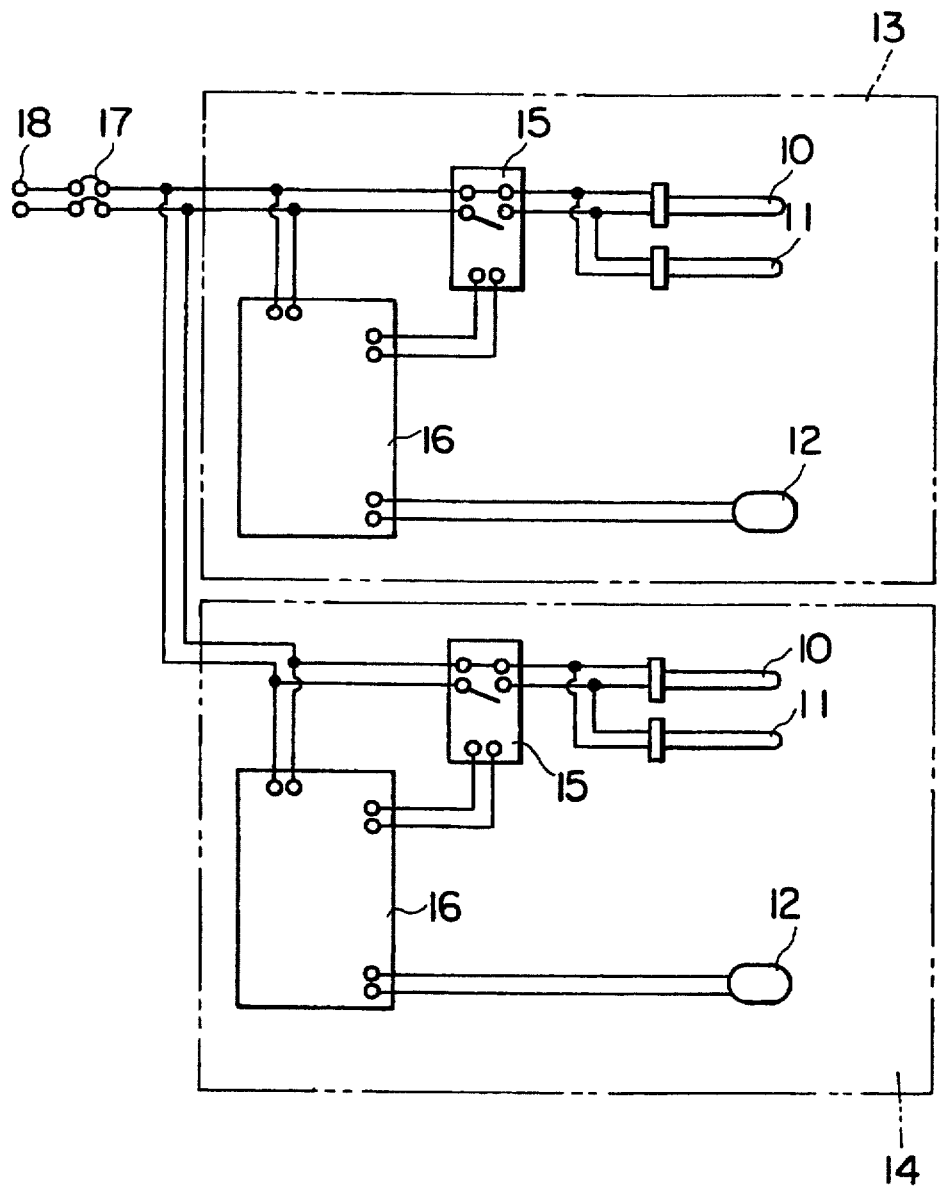
FIG. 8 is a circuit diagram illustrating the temperature control of the MRI-use magnetic field generator of the present invention.
Figure 9A:
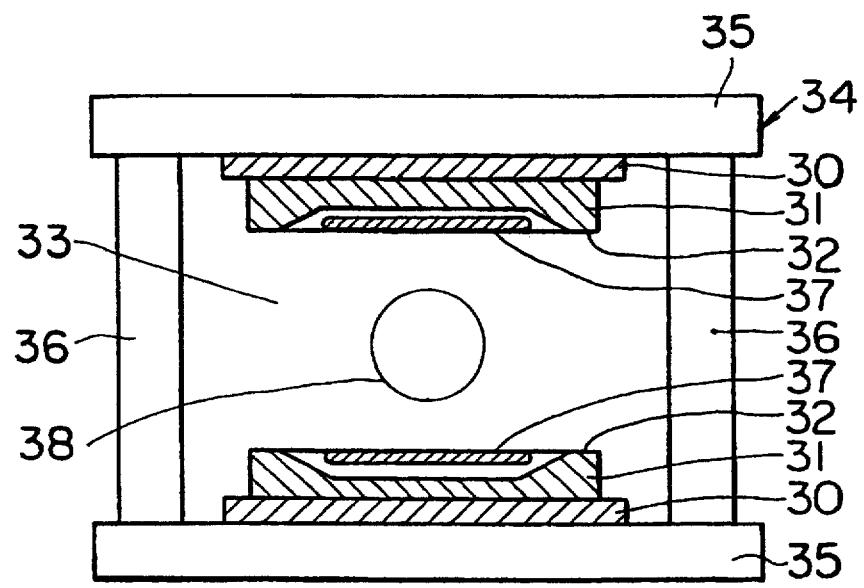
FIG. 9A is a partially cut-away front view illustrating the structure of a conventional MRI-use magnetic field generator.
Figure 9B:
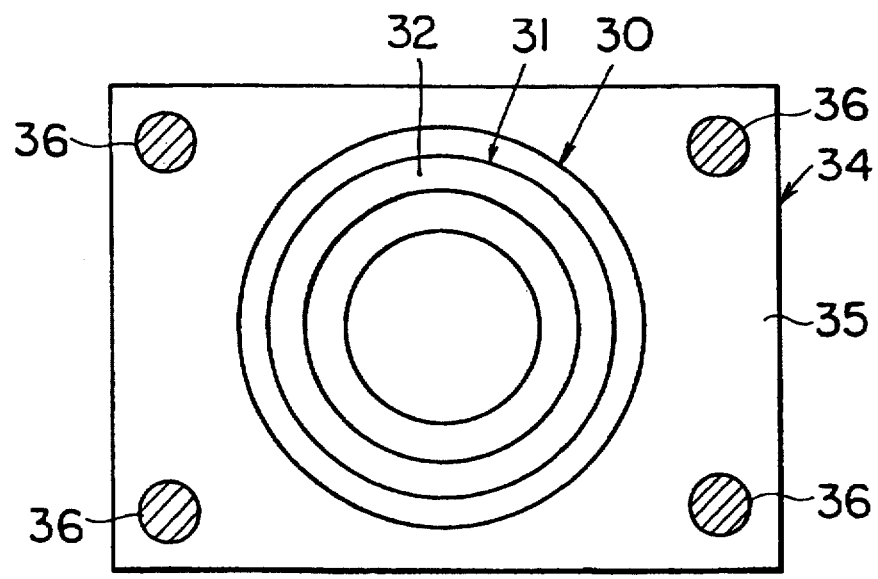
FIG. 9B is a lateral cross section thereof.

Here, these elements are connected to two-part temperature control systems 13 and 14 structured as shown in FIG. 8. With the temperature control systems 13 and 14, control signals from temperature regulators 16 are sent to solid state relays 15, with this signal representing the difference between the temperature setting and the temperature of the permanent magnets as detected by the temperature sensor 12 disposed around the outer periphery of the permanent magnets 5. Controlled current passes through the solid state relays 15 to the rod-shaped heating elements 10 and 11, and suitable heating is performed according to the respective temperatures of the permanent magnets 5. As a result, a specified temperature is maintained, without any temperature unevenness occurring in the magnetic circuit, and particularly the entire permanent magnets.

Figure 1A:
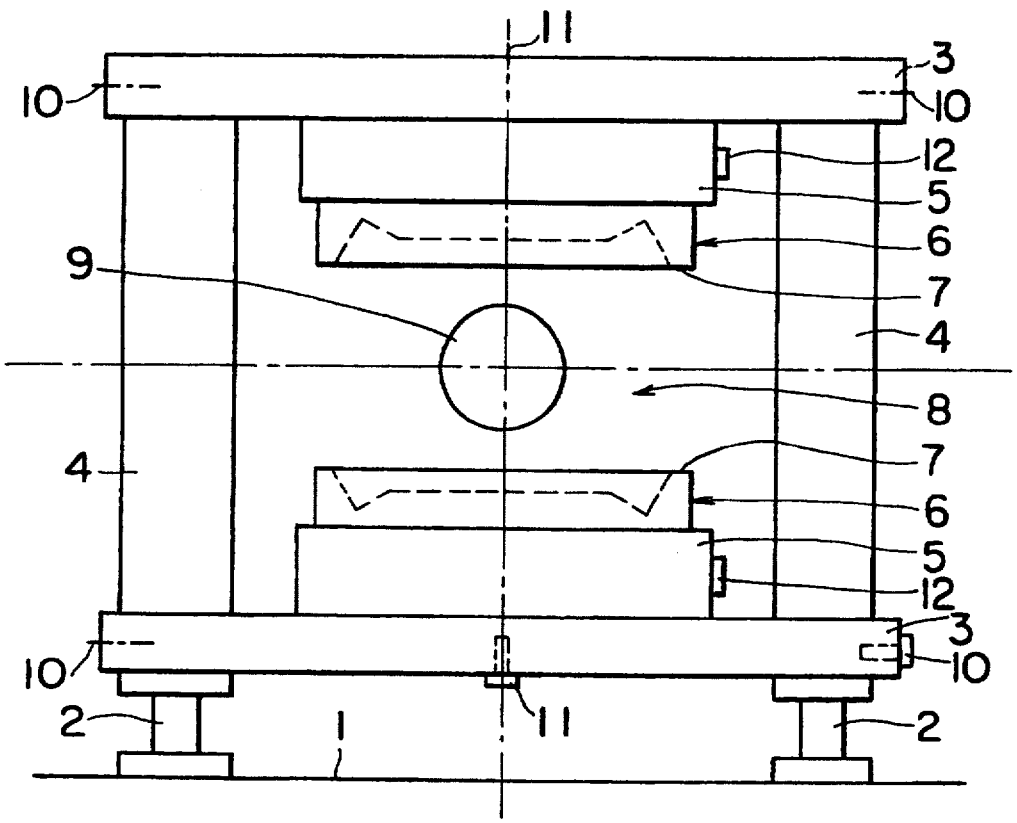
FIG. 1A is a front view illustrating the structure of the MRI-use magnetic field generator of the present invention.
Figure 2:
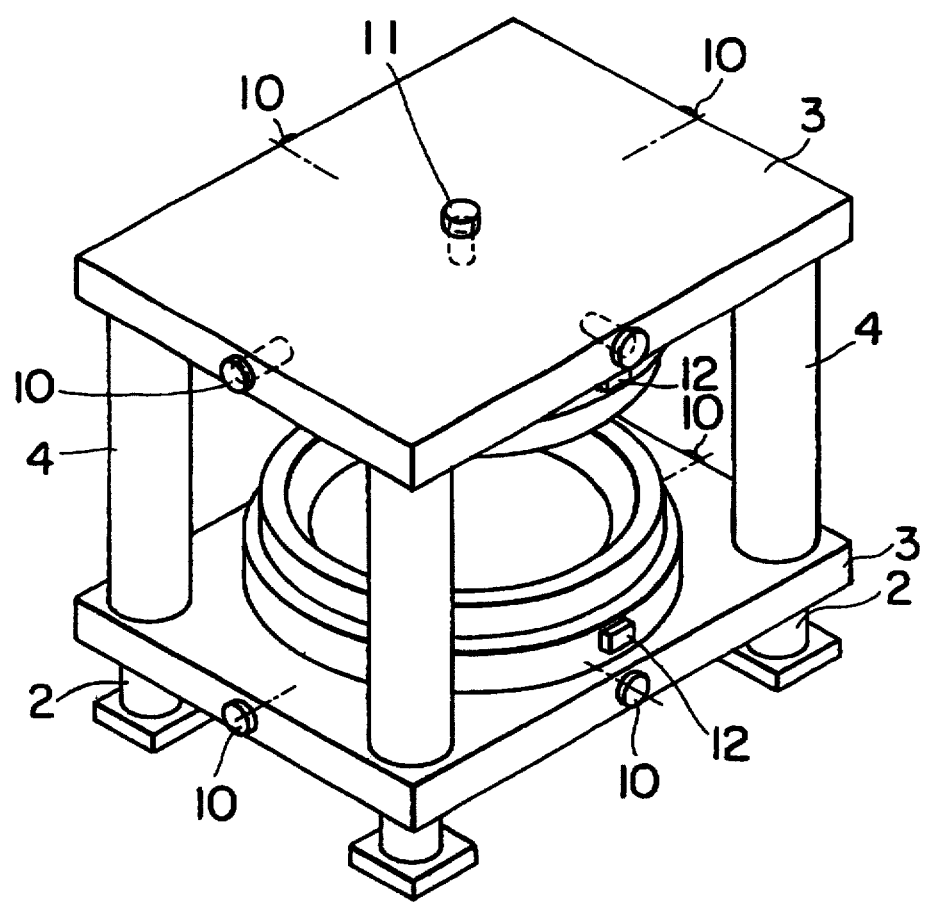
FIG. 2 is an oblique view of the MRI-use magnetic field generator of the present invention.

With a magnetic circuit as shown in FIG. 1A, in which permanent magnets 5 are disposed facing each other on upper and lower base yokes 3, if the temperature of the heaters disposed at the upper and lower base yokes 3 is controlled just by the detection made by the temperature sensor disposed at one of the permanent magnets, then there will be a tendency for the temperature of the heater disposed in the base yoke where the permanent magnet is disposed on the side with no temperature sensor to be controlled somewhat lower than the optimal temperature.

To control the entire magnetic circuit to an even temperature, the separate temperature control systems 14 and 14 shown in FIG. 8 must be provided to the upper and lower base yokes 3. Specifically, the electrical circuit is structured such that there are independent control systems 13 and 14, one for the temperature sensor 12 attached to the permanent magnet 5 disposed at the upper base yoke 3 and the rod-shaped heating element 10 incorporated into the upper base yoke 3, and one for the temperature sensor 12 attached to the permanent magnet 5 disposed at the lower base yoke 3 and the rod-shaped heating element 10 incorporated into the lower base yoke 3.

A plurality of rod-shaped heating elements 10 and 11 are connected to each of the control systems 13 and 14. This is to prevent local heating of the magnetic circuit, and heat the overall circuit evenly. Also, although not shown in the figures, an adiabatic material for thermally isolating the magnetic circuit from the surrounding air can be suitably disposed.

Figure 3:
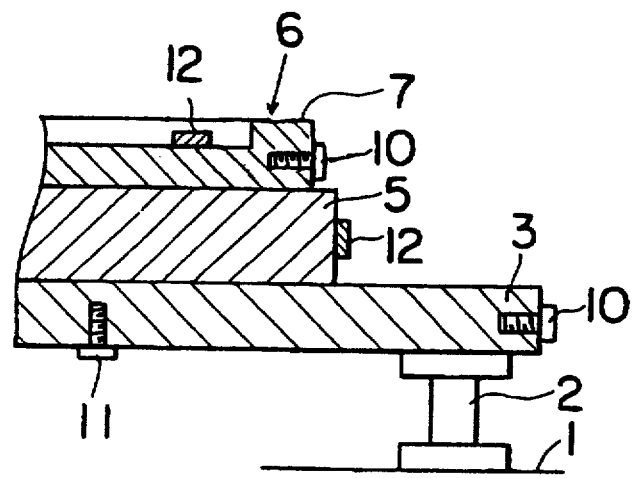
FIG. 3 is a vertical cross section illustrating the main components of another example of the MRI-use magnetic field generator of the present invention.

The structure in FIG. 3 is such that a temperature control means consisting of a rod-shaped heating element 10 is incorporated not only the base yoke 3, but also into the pole piece 6. Specifically, an electrical circuit is configured such that the rod-shaped heating element 10 incorporated into the pole piece 6 and the temperature sensor 12 disposed on the pole piece 6 are integrated into a single control system.

Figure 4:
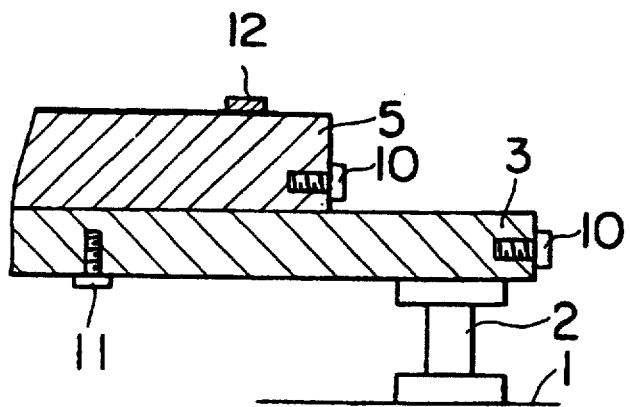
FIG. 4 is a vertical cross section illustrating the main components of another example of the MRI-use magnetic field generator of the present invention.

The structure in FIG. 4 is such that the permanent magnet 5 forms a cavity for direct magnetic field generation. Specifically, a temperature control means consisting of a rod-shaped heating element 10 is incorporated into the base yoke 3 and the permanent magnet 5, and a temperature sensor 12 is provided to the cavity-facing side of the permanent magnet 5. Here, an electrical circuit is configured such that the rod-shaped heating element 10 incorporated into the permanent magnet 5 and the temperature sensor 12 disposed at the permanent magnet 5 are integrated into a single control system.

As mentioned above, it is possible for the temperature control means to be disposed in either the permanent magnets, the base yokes, or the pole pieces. The temperature control means in the present invention is provided in order to control the temperature of the permanent magnets, and a structure in which it is directly provided to the permanent magnets is the most effective in terms of thermal efficiency.

Nevertheless, since subtle changes in the temperature of the permanent magnets directly affect changes in the magnetic field, when the permanent magnets are directly heated and cooled, it is preferable for the detection of permanent magnet temperature by the temperature sensors and feedback to the temperature control means to be carried out frequently and in a short cycle.

Also, since heating more than necessary decreases the magnetic field intensity, controlling the temperature of the permanent magnets merely with temperature control means disposed at the permanent magnets cannot be considered a favorable structure. A preferable structure makes use of temperature control means in the base yokes, pole pieces, and so on.

A structure in which the temperature control means is disposed at the base yokes is not necessarily good in terms of thermal efficiency because the temperature of the permanent magnet is controlled indirectly. The base yokes, however, have a much larger volume than the permanent magnets, and once they have been adjusted to a specific temperature, they are not readily affected by changes in the ambient temperature, so their temperature is more stable, and therefore the temperature of the permanent magnet connected to the base yokes can be easily kept constant. Also, because the base yokes are easier to machine than the permanent magnets, the holes in which the rod-shaped heating elements, heat pipes, etc., will be disposed can be formed at any location. It is therefore possible to keep the temperature uniform, without causing any temperature unevenness in the base yokes Themselves.

A structure in which the temperature control means is disposed at the pole pieces is not necessarily good in terms of thermal efficiency, either, because the temperature of the permanent magnet is controlled indirectly. Still, heating and cooling can be performed more efficiently than with a structure involving disposition at the base yokes because the volume of the pole pieces is smaller and is about the same as that of the permanent magnets. Furthermore, by controlling the temperature of the pole pieces, it is also possible to reduce the effect of temperature changes on the permanent magnets due to the generation of heat by the tilt field coils disposed in the vicinity of the pole pieces. In particular, by disposing a plurality of temperature control means at radial locations of the pole pieces, it is possible to keep the temperature even for the entire pole pieces.

As mentioned above, it is also possible in the present invention for the temperature control means to be incorporated in either the permanent magnets, the base yokes, or the pole pieces. To keep the permanent magnets at a constant temperature, it is preferable to select the capacity, disposition location, disposition quantity, and so forth of the temperature control means after taking into account the various volumes, materials, and so on involved.

In the examples shown in FIGS. 1A, 1B, 3, and 4, the illustrated structure makes use of a rod-shaped heating element as the temperature control means. In a similar structure, it is also possible to use concurrently a cooling means featuring a heat pipe or the like. Specifically, a structure can be employed in which a cooling means is disposed at the permanent magnets, or in which heating means and cooling means are both disposed at the base yokes.

Figure 1B:
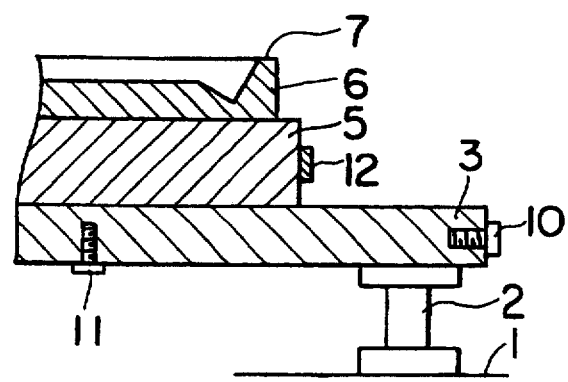
FIG. 1B is a vertical cross section illustrating the main components in FIG. 1A.

Using the magnetic field generator of the present invention shown in FIGS. 1A and 1B, the target temperature of the upper and lower permanent magnets 5 was set to 32° C. by the two-part temperature control systems 13 and 14 shown in FIG. 8, whereupon the temperature differential between the upper and lower magnets could be held to 0.1° C., and the energy consumption was 600 W.

Figure 10:
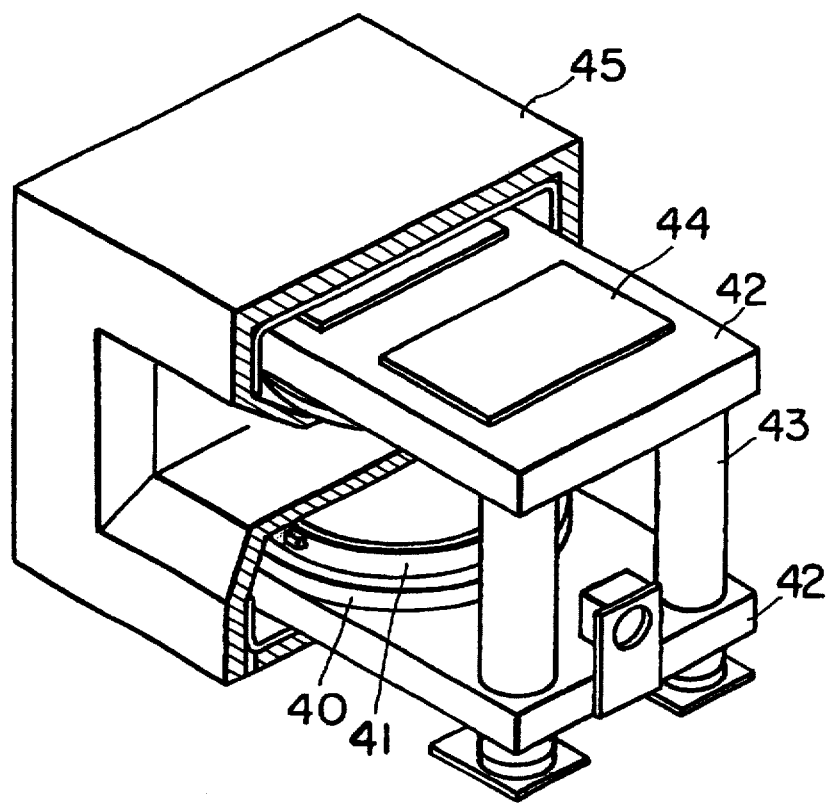
FIG. 10 is a partially cut-away oblique view illustrating the structure of another conventional MRI-use magnetic field generator.

In contrast, with a magnetic field generator having a conventional structure in which a sheet heater was disposed on the outside of the base yokes as shown in FIG. 10, because the control was effected by a single temperature control system, the temperature differential between the upper and lower magnets was 2 to 3° C., and the energy consumption was 1200 W.

Specifically, the structure of the present invention not only allows for high-precision temperature control, but also makes possible a major reduction in energy consumption.

Also, using the magnetic field generator of the present invention shown in FIGS. 1A and 1B, the target temperature of the permanent magnets 5 was set to 32° C. by a four-part temperature control system in which temperature control means corresponding to the structure of FIG. 3 were also disposed at the pole pieces, whereupon it was confirmed that the temperature differential between the upper and lower magnets could be held to 0.1° C. even with respect to external temperature changes due to heat generated by the tilt field coils, etc.

INDUSTRIAL APPLICABILITY

The MRI-use magnetic field generator of the present invention is characterized by a structure in which temperature control means are embedded in the base yokes and 80 forth that make up the magnetic path formation members. When the temperature control means executes heating or cooling by means of a temperature regulator according to the temperature detected by temperature sensors, the permanent magnets disposed in the vicinity of the base yokes or the like are heated or cooled efficiently, and follow-up with respect to control signals is good.

Also, in the case of a temperature control means, such as a heater, embedded in the interior of the base yokes or the like, the heat generated by the heater is conducted through the base yokes, etc., and reaches the permanent magnets directly, so the heat is not diffused to the outside and lost, allowing temperature control to be performed extremely efficiently.

Furthermore, partial temperature control is possible by disposing a plurality of temperature sensors at the permanent magnets. Another advantage is that good symmetry can be achieved in the magnetic field uniformity by controlling the temperature through control of the temperature control means with a plurality of control systems independently provided to a plurality of permanent magnets.

What is claimed is:

1. An MRI-use magnetic field generator which comprises: magnetic path-formation members that form a magnetic circuit, a plurality of permanent magnets which generate a magnetic field within an imaging space located within said magnetic circuit, a heating means located within at least one of said magnetic path-formation members and said plurality of permanent magnets, a temperature sensor for detecting a temperature of at least one of said magnetic path-formation members and said plurality of permanent magnets, and a temperature regulator for regulating the temperature of said heating means based on a temperature detected by said temperature sensor.

2. The MRI-use magnetic field generator according to claim 1, including a plurality of temperature sensors disposed within the permanent magnets and/or the magnetic path formation members, and wherein said temperature regulator controls the temperature of said heating means according to temperatures detected by the plurality of temperature sensors.

3. The MRI-use magnetic field generator according to claim 1, including means for halting the working of the temperature control means according to the temperature of the permanent magnets and/or the magnetic path formation members.

4. The MRI-use magnetic field generator according to claim 1, wherein the magnetic path-formation members comprise a pair of base yokes that face each other to form a cavity having an imaging space, said permanent magnets being disposed on their various cavity-facing sides, and support yokes that connect and support these base yokes.

5. The MRI-use magnetic field generator according to claim 4, including a plurality of temperature sensors disposed in the permanent magnets and/or the base yokes, and wherein said temperature regulator controls the temperature of said heating means according to temperatures detected by the temperature sensors.

6. The MRI-use magnetic field generator according to claim 1, wherein the magnetic path-formation members comprise a pair of base yokes that face each other to form a cavity having an imaging space, said permanent magnets are disposed on their various cavity-facing sides, support yokes that connect and support these base yokes, and including a pair of pole pieces disposed on the cavity-facing sides of the permanent magnets.

7. The MRI-use magnetic field generator according to claim 6, including a plurality of temperature sensors disposed at least in one of the permanent magnets and base yokes and pole pieces, and wherein said temperature regulator controls the temperature of said heating means according to the temperature detected by the temperature sensors.

8. The MRI-use magnetic field generator according to claim 5 or 7, wherein the temperature of the heating means incorporated within the base yokes is controlled according to the temperature detected by the temperature sensors disposed in the permanent magnets.

9. The MRI-use magnetic field generator according to claim 5 or 7, wherein the temperature of the heating means incorporated into the permanent magnets is controlled according to the temperature detected by the temperature sensors disposed in the permanent magnets.

10. The MRI-use magnetic field generator according to claim 5 or 7, including at least two control systems that independently control the various temperatures of the pair of permanent magnets.

11. The MRI-use magnetic field generator according to claim 5 or 7, including an adiabatic material covering at least a periphery of the base yokes.

12. The MRI-use magnetic field generator according to claim 7, wherein the temperature of the heating means incorporated into the pole pieces is controlled according to the temperature detected by the temperature sensors disposed in the permanent magnets or pole pieces.

13. The MRI-use magnetic field generator according to claim 1, wherein the heating means is a rod-shaped heating element.

14. The MRI-use magnetic field generator according to claim 1, wherein the rod-shaped heating element includes retaining means.

15. The MRI-use magnetic field generator according to claim 1, wherein the temperature control means is a heat pipe.

* * * * *